US012631961B2

(12) United States Patent (10) Patent No.: US 12,631,961 B2
Clark et al. (45) Date of Patent: May 19, 2026

(54) MONOALKYL TIN TRIALKOXIDES AND/OR MONOALKYL TIN TRIAMIDES WITH LOW METAL CONTAMINATION AND/OR PARTICULATE CONTAMINATION, AND CORRESPONDING METHODS

(71) Applicant: Inpria Corporation, Corvallis, OR (US)

(72) Inventors: Benjamin L. Clark, Corvallis, OR (US); Dominick Smiddy, Corvallis, OR (US); Thomas J. Lamkin, Corvallis, OR (US); Mark Genzia, Corvallis, OR (US); Joseph B. Edson, Corvallis, OR (US); Craig M. Gates, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 0 days.

(21) Appl. No.: 18/136,414

(22) Filed: Apr. 19, 2023

(65) Prior Publication Data

US 2023/0251569 A1 Aug. 10, 2023

Related U.S. Application Data

(62) Division of application No. 16/262,233, filed on Jan. 30, 2019, now Pat. No. 11,966,158.

(51) Int. Cl.
  *G03F 7/004* (2006.01)
  *G03F 7/20* (2006.01)
(52) U.S. Cl.
  CPC .......... *G03F 7/0042* (2013.01); *G03F 7/2004* (2013.01)
(58) Field of Classification Search
  CPC ..... G03F 7/0042; G03F 7/0043; G03F 7/2004
  See application file for complete search history.

(56) References Cited

U.S. PATENT DOCUMENTS

| | | | |
|---|---|---|---|
| 2,675,399 A | 4/1954 | Ramsden et al. | |
| 2,822,409 A | 2/1958 | Gwynn et al. | |
| 3,398,169 A | 8/1968 | Neumann et al. | |
| 5,980,978 A | 11/1999 | Jones et al. | |
| 6,458,984 B1 | 10/2002 | Baum et al. | |
| 6,517,901 B1 | 2/2003 | Minami et al. | |
| 7,321,048 B2 | 1/2008 | Shenai-Katkhate et al. | |
| 7,842,828 B2 | 11/2010 | Bijanto et al. | |
| 8,198,352 B2 | 6/2012 | Deelman et al. | |
| 8,278,470 B2 | 10/2012 | Yanagihara et al. | |
| 8,310,684 B2 | 11/2012 | Lee et al. | |
| 8,633,330 B2 | 1/2014 | Merz, III et al. | |
| 9,745,450 B2 | 8/2017 | Frenkel et al. | |
| 10,228,618 B2 | 3/2019 | Meyers et al. | |
| 10,975,109 B2 | 4/2021 | Edson et al. | |
| 11,498,934 B2 * | 11/2022 | Clark ................... | G03F 7/0042 |
| 11,643,422 B2 | 5/2023 | Odedra et al. | |
| 12,024,534 B2 * | 7/2024 | Clark ................... | G03F 7/0042 |
| 2004/0211941 A1 | 10/2004 | Miyoshi | |
| 2007/0262471 A1 | 11/2007 | Cleeves | |
| 2008/0269405 A1 | 10/2008 | Okamoto et al. | |
| 2011/0166268 A1 | 7/2011 | Deelman et al. | |
| 2012/0223418 A1 | 9/2012 | Stowers et al. | |
| 2013/0004727 A1 | 1/2013 | Inagaki et al. | |
| 2013/0281725 A1 | 10/2013 | Merz, III et al. | |
| 2014/0087066 A1 | 3/2014 | Wang et al. | |
| 2015/0331322 A1 | 11/2015 | Carcasi et al. | |
| 2016/0116839 A1 | 4/2016 | Meyers et al. | |
| 2017/0002180 A1 | 1/2017 | Frenkel et al. | |
| 2017/0102612 A1 | 4/2017 | Meyers et al. | |
| 2017/0334935 A1 | 11/2017 | Pieper et al. | |
| 2018/0364568 A1 | 12/2018 | Tsubaki et al. | |
| 2019/0315781 A1 | 10/2019 | Edson et al. | |
| 2020/0073238 A1 | 3/2020 | Zi et al. | |
| 2020/0124970 A1 | 4/2020 | Kocsis et al. | |
| 2020/0239498 A1 | 7/2020 | Clark et al. | |
| 2020/0241413 A1 | 7/2020 | Clark et al. | |

FOREIGN PATENT DOCUMENTS

| | | |
|---|---|---|
| DE | 3109309 A1 | 9/1982 |
| EP | 2123659 A1 | 11/2009 |
| EP | 3435158 A1 | 1/2019 |
| JP | 2010-094583 A | 4/2010 |
| JP | 58-64248 A | 7/2013 |
| JP | 2018-502173 A | 1/2018 |
| JP | 2019-500490 A | 1/2019 |
| KR | 10-2018-0054917 A | 5/2018 |
| TW | 2016-31377 A | 9/2016 |

(Continued)

OTHER PUBLICATIONS

English Translation of WO2018/043690 (Year: 2018).*
Hänssgen et al., "Synthesis of the First Mono-t-butyltin Element Connections", Organometallic Chemistry, 293:191-195 (1985). (English Abstract).
Jaumier et al., "Transmetalation of Tetraalkynyltin Compounds With Grignard Reagents: Access to Mono-and Dialkyltin Products", Angewandte Chemie International Edition, 38(3):402-404 (Feb. 1, 1999).
Jaumier et al., "New Route to Monoorganotin Oxides and Alkoxides From Trialkynylorganotins", Chemical Communications, (3):369-370 (1998).
Jones et al., "Amino-Derivatives of Metals and Metalloids. Part I. Preparation of Aminostannenes, Stannylamines and Stannazanes", Journal of the Chemical Society, 1944-1951 (1965).

(Continued)

*Primary Examiner* — Daborah Chacko-Davis
(74) *Attorney, Agent, or Firm* — Christensen, Fonder, Dardi, Busse; Diane E. Bennett; Peter S. Dardi

(57) ABSTRACT

The purification of monoalkyl tin trialkoxides and monoalkyl tin triamides are described using fractional distillation and/or ultrafiltration. The purified compositions are useful as radiation sensitive patterning compositions or precursors thereof. The fractional distillation process has been found to be effective for the removal of metal impurities down to very low levels. The ultrafiltration processes have been found to be effective at removal of fine particulates. Commercially practical processing techniques are described.

23 Claims, 5 Drawing Sheets

(56) References Cited

FOREIGN PATENT DOCUMENTS

| | | | | | |
|---|---|---|---|---|---|
| TW | 2017-34025 | A | 10/2017 | | |
| WO | 2012-099253 | A1 | 7/2012 | | |
| WO | 2017-163922 | A1 | 9/2017 | | |
| WO | WO2018/043690 | * | 3/2018 | ............. | G03F 7/004 |
| WO | 2017-164018 | A | 11/2018 | | |
| WO | 2019-023797 | A1 | 2/2019 | | |
| WO | 2018-142888 | A | 12/2019 | | |

OTHER PUBLICATIONS

Pauli et al., "Importance of Purity Evaluation and the Potential of Quantitative 1H NMR as a Purity Assay" Journal of Medicinal Chemistry (2014) vol. 57, pp. 9220-9231.

Puff et al., "Zur Hydrolyse von Monoorganylzinn-trihalogeniden", Journal of Organometallic Chemistry, 368:173-183 (1989).

Weber et al., "Method development in quantitative NMR towards metrologically traceable organic certified reference materials used as 31P qNMR standards", Anal Bioanal Chem (2015), 407:3115-3126.

Williams et al., "Drying of Organic Solvents: Quantitative Evaluation of the Efficiency of Several Desiccants," J. Organic Chemistry 2010, 75 (24), 8351-8354. (Abstract).

Office Action from corresponding Taiwan Patent Application No. 109100437 dated Jul. 9, 2020.

Office Action from corresponding Japanese Patent Application No. 2020-008698 dated Jan. 26, 2021.

Office Action from corresponding Korean Patent Application No. 10-2020-0005513 dated Jul. 6, 2021.

* cited by examiner

MONOALKYL TIN TRIALKOXIDES AND/OR MONOALKYL TIN TRIAMIDES WITH LOW METAL CONTAMINATION AND/OR PARTICULATE CONTAMINATION, AND CORRESPONDING METHODS

CROSS REFERENCE TO RELATED APPLICATIONS

This divisional application claims priority to co-pending U.S. patent application Ser. No. 16/262,233 filed Jan. 30, 2019 to Clark et al., entitled "Monoalkyl Tin Trialkoxides And/Or Monoalkyl Tin Triamides With Low Metal Contamination And/Or Particulate Contamination, and Corresponding Methods," which is incorporated herein by reference.

FIELD OF THE INVENTION

The invention relates to monoalkyl tin compositions, specifically monoalkyl tin trialkoxides and monoalkyl tin triamides, that have been processed to have low metal contamination and/or low particle contamination. The invention further relates to solutions made with the low metal contamination monoalkyl tin compositions that can be used for radiation patterning, such as photoresists effective for EUV lithography. The invention further relates to corresponding processes for forming the purified monoalkyl tin compositions.

BACKGROUND OF THE INVENTION

Solutions of organometallic compounds form coatings containing radiation sensitive metal-carbon bonds that can be used to pattern structures lithographically. The processing of semiconductor materials and devices with ever shrinking dimensions results in demands for high-purity solutions with low particle counts to mitigate contamination issues, minimize pattern defects, and enable the advantages of organometallic photoresists. The processing and performance of semiconductor materials for microelectronics applications can be sensitive to metal contaminants. To produce microelectronic products using lithography, the proper control of metal contaminants can reduce waste from failure to meet product specifications.

SUMMARY OF THE INVENTION

In a first aspect, the invention pertains to a composition comprising a solvent and a monoalkyl tin trialkoxide (RSn (OR')$_3$) having a tin concentration from about 0.004M to about 1.4 M and a contamination with other metals or metalloid elements of each no more than 10 parts-per-billion (ppb) by mass.

In a further aspect, the invention pertains to a composition comprising a solvent and a monoalkyl tin triamide (RSn (NR'$_2$)$_3$) having a tin concentration from about 0.01M to about 1.4M and a contamination with other metals or metalloid elements of each no more than 50 parts-per-billion (ppb) by mass.

In another aspect, the invention pertains to a method of forming a monoalkyl tin trialkoxide or monoalkyl tin triamide having low metal contamination, in which the method comprises performing fractional distillation of a monoalkyl tin trialkoxide or monoalkyl tin triamide with temperatures, pressures and equipment selected to collect the monoalkyl tin trialkoxide or monoalkyl tin triamide with a contamination of other metals or metalloids of each not more than 50 ppb by mass. In some embodiments, the composition for purification is placed in a distillation vessel (and up to 10 vol % tris(2-aminoethyl)amine with the monoalkyl tin triamide) in association with a heating element and wherein at least about 0.5 vol % is left in the distillation vessel.

In other aspects, the invention pertains to a composition comprising a solvent and monoalkyl tin trialkoxide (RSn (OR')$_3$) or monoalkyl tin triamide (RSn(NR'$_2$)$_3$) with a tin concentration from about 0.005M to about 0.5M and having no more than about 40 particles per mL with a particle size of at least about 70 nm.

Moreover, the invention pertains to a method for preparing a radiation sensitive composition comprising solvent and an organometallic composition selected from the group consisting of monoalkyl tin trialkoxide, monoalkyl tin triamide, or a mixture thereof, the method comprising the step of flowing the composition using an impeller style pump through a filter to remove particulate contaminants to form a filtered composition with a measured concentration of particles with a size of at least 70 nm is below 100 particles per mL.

DETAILED DESCRIPTION OF THE INVENTION

Figure 1:
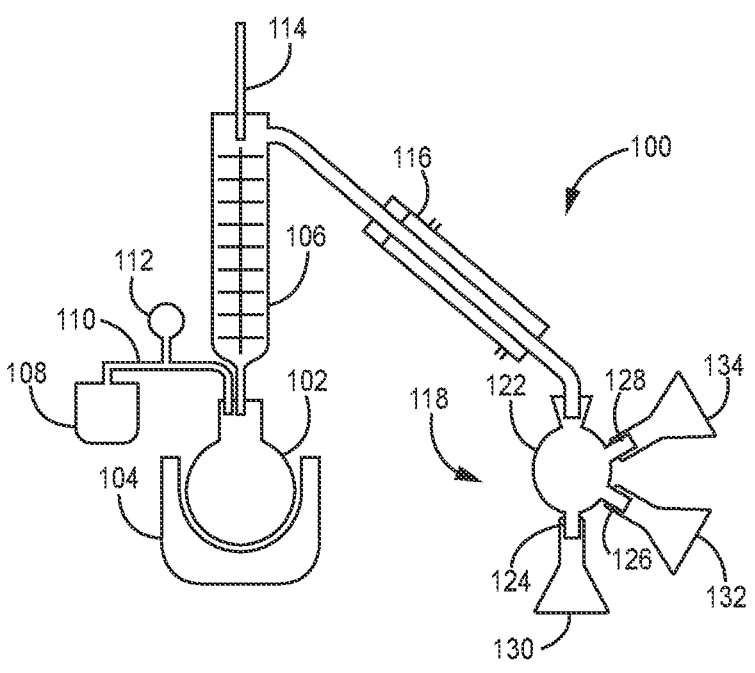
FIG. 1 is a schematic view of a fractional distillation apparatus suitable for purification of monoalkyl tin compositions.

Monoalkyl tin alkoxides and monoalkyl tin amides have been formed having very low metal contamination in the parts per billion range. The tin compositions can be selected to have high EUV absorption such that the compositions can be useful for EUV patterning in semiconductor manufacturing. In particular, monoalkyl tin compositions have been found to provide very effective EUV patterning resists that can be used to form very fine structures. Fractional distillation has been found to be effective for the purification of the compounds with respect to metal impurities. The processing can also be used to separate the monoalkyl tin compounds from polyalkyl tin contaminants. The purified compositions can then be further diluted with semiconductor grade solvents, and optionally others compositions, to form desired patterning products. Additionally or alternatively, improved filtering techniques can also provide low particulate contamination in radiation resist compositions. The purified radiation resist compositions are suitable for patterning of very small features with low patterned product failure rates and high yield.

For semiconductor processing and other microelectronics applications, metal contaminants can be detrimental and can result in product failure and high processing loss rates due to failure of components to meet specifications. The threshold contaminant levels that are detrimental for significant products can be very low. Therefore, there is considerable motivation to reduce significantly metal contaminants. Radiation based patterning has been the key process technology to form ever shrinking component sizes, and the demand for this shrinkage has pushed radiation based patterning into higher energy radiation regimes, such as extreme ultra violet light and electron beams. To take advantage of the finer patterns available using higher energy radiation, organometallic based radiation resists, especially organotin compounds, have been found with a high level of performance. For processing with organotin compounds, in addition to managing the introduction and removal of the tin, it is desirable to avoid introduction of contamination by other metals. As described herein, contaminating metals can be reduced to parts-per-billion by mass levels.

It has been discovered that appropriate purification processing can be used to effectively reduce non-tin metal contamination to very low levels specifically for monoalkyl tin trialkoxides and monoalkyl tin triamides. Based on experience with the application of these compositions for radiation resist materials, it can also be desirable to eliminate polyalkyl tin compounds, and the processing for the metal contaminations can also be effective to remove the polyalkyl tin contaminants. In particular, the monoalkyl tin trialkoxides and monoalkyl tin triamides can be purified using fractional distillation using a suitable distillation column and in some embodiments through appropriate selection of the distillation fractions. Corresponding handling of the purified compositions can maintain the high purity of the compositions. Furthermore, the purified compositions can be filtered to remove particulate contaminants that can result in patterning imperfections. Improved filtration can use continuous impeller style pumps to circulate and recirculate the photoresists through semiconductor grade filters to remove particulates. The particulate removal can be verified using in line light scattering measurements.

The use of organometallic tin compositions as photoresists, especially for extreme ultraviolet based patterning, is generally based on monoalkyl tin oxo hydroxo compounds. The oxo hydroxo compounds can be made in solution, or they can be made during and/or subsequent to an in situ coating process involving water based hydrolysis of $RSnX_3$ compounds in which R is an alkyl group and Sn—X is a hydrolysable group. Monoalkyl tin triamides and monoalkyl tin trialkoxides are suitable precursor compounds for forming the monoalkyl tin oxo hydroxo compounds, and monoalkyl tin triamides are suitable precursors for forming monoalkyl tin trialkoxides. Current best practices for using these resist compositions comprise forming a coating of monoalkyl tin trialkoxide, and hydrolyzing the trialkoxide in situ to form the oxo hydroxo compositions with a volatile alcohol by product that readily evaporates. The processing and compositions described herein are generally useful for such previously described processes and compositions as well as for other monoalkyl tin based photoresist patterning processes and compositions beyond the current best practices. Monoalkyl tin triamides can thus be useful intermediate products in the preparation of organotin photoresists either through their use to synthesize monoalkyl tin trialkoxides or for the deposition and in situ processing to form the monoalkyl tin oxo-hydroxo compositions.

Methods for the preparation of monoalkyl tin triamides have previously employed lithium reagents to convert tin tetraamides to the desired triamides. For example, t-butyl tris(diethylamido)tin, ($\text{t-BuSn(NEt}_2)_3$), can be synthesized with a lithium reagent according to the method of Hänssgen, D.; Puff, H.; Beckerman, N. J. Organomet. Chem. 1985, 293, 191, incorporated herein by reference. These methods with lithium reagents, however, can produce a mixture of monoalkyl and dialkyl tin products. Lithium alkyls are often highly reactive compounds. They can ignite spontaneously with air, moisture, or both to form flammable alkanes and corrosive lithium hydroxide. Consequently, great care and expense are required to handle lithium alkyls. Also, lithium contaminants can be undesirable for semiconductor applications, and the processes described herein are directed to reduction of non-tin metal contaminants. While the lithium contamination can be removed using purification techniques described herein, improved synthesis techniques have been developed that do not use the lithium reactants. These improved synthesis techniques are described in co-pending U.S. patent application Ser. No. 15/950,292 to Edson et al. (hereinafter the '292 application), entitled "Monoalkyl Tin Compounds With Low Polyalkyl Contamination, Their Compositions and Methods," incorporated herein by reference. Further processing can be used to decrease both the polyalkyl tin contaminants and the non-tin metal contaminants.

The use of alkyl metal coordination compounds in high performance radiation-based patterning compositions is described, for example, in U.S. Pat. No. 9,310,684 to Meyers et al., entitled "Organometallic Solution Based High Resolution Patterning Compositions," incorporated herein by reference. Refinements of these organometallic compositions for patterning are described in published U.S. patent applications 2016/0116839 A1 to Meyers et al., entitled "Organometallic Solution Based High Resolution Patterning Compositions and Corresponding Methods," and 2017/0102612 A1 to Meyers et al. (hereinafter the '612 application), entitled "Organotin Oxide Hydroxide Patterning Compositions, Precursors, and Patterning," both of which are incorporated herein by reference.

The compositions synthesized herein can be effective precursors for forming the alkyl tin oxo-hydroxo compositions that are advantageous for high resolution patterning. The alkyl tin precursor compositions comprise a group that can be hydrolyzed with water or other suitable reagent under appropriate conditions to form the alkyl tin oxo-hydroxo patterning compositions, which can be represented by the formula $RSnO_{(1.5-(x/2))}(OH)_x$ where $0 < x \le 3$. The hydrolysis and condensation reactions that can transform the compositions with hydrolyzable Sn—X groups are indicated in the following reactions:

$$RSnX_3 + 3H_2O \rightarrow RSn(OH)_3 + 3HX,$$

$$RSn(OH)_3 \rightarrow RSnO_{(1.5-(x/2))}OH_x + (x/2)H_2O.$$

If the hydrolysis product HX is sufficiently volatile, in situ hydrolysis can be performed with water vapor during the substrate coating process, but the hydrolysis reaction can also be performed in solution to form the alkyl tin oxo-hydroxo compositions. These processing options are described further in the '612 application.

The monoalkyl tin triamide compositions generally can be represented by the formula $RSn(NR')_3$, where R and R' are independently an alkyl or a cycloalkyl with 1-31 carbon atoms with one or more carbon atoms optionally substituted with one of more heteroatom functional groups containing O, N, Si, Ge, Sn, Te, and/or halogen atoms or an alkyl or a cycloalkyl further functionalized with a phenyl or cyano group. In some embodiments, R' can comprise ≤10 carbon atoms and can be, for example, methyl, ethyl, propyl, isopropyl, butyl, t-butyl, isobutyl, or t-amyl. The R group can be a linear, branched, (i.e., secondary or tertiary at the metal-bonded carbon atom), or cyclic hydrocarbyl group. Each R group individually and generally has from 1 to 31 carbon atoms with 3 to 31 carbon atoms for the group with a secondary-bonded carbon atom and to 31 carbon atoms for the group with a tertiary-bonded carbon atom. In particular, branched alkyl ligands can be desirable for some patterning compositions where the compound can be represented as $R^1R^2R^3CSn(NR')_3$, where $R^1$ and $R^2$ are independently an alkyl group with 1-10 carbon atoms, and $R^3$ is hydrogen or an alkyl group with 1-10 carbon atoms. As noted below, this representation of alkyl ligand R is similarly applicable to the other embodiments generally with $R^1R^2R^3CSn(X)_3$, with X corresponding to the trialkoxide or triamide moieties. In some embodiments $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —$CH_2CH_3$), sec-butyl ($R^1$ is methyl, $R^2$ is —$CH_2CH_3$, and $R^3$ is hydrogen), neopentyl ($R^1$ and $R^2$ are hydrogen, and $R^3$ is —$C(CH_3)_3$), cyclohexyl, cyclopentyl, cyclobutyl, and cyclopropyl. Examples of suitable cyclic groups include, for example, 1-adamantyl (—$C(CH_2)_3$ $(CH)_3(CH_2)_3$ or tricyclo(3.3.1.13,7) decane bonded to the metal at a tertiary carbon) and 2-adamantyl (—$CH(CH)_2$ $(CH_2)_4(CH)_2(CH_2)$ or tricyclo(3.3.1.13,7) decane bonded to the metal at a secondary carbon). In other embodiments hydrocarbyl groups may include aryl or alkenyl groups, for example, benzyl or allyl, or alkynyl groups. In other embodiments the hydrocarbyl ligand R may include any group consisting solely of C and H and containing 1-31 carbon atoms. In summary, some examples of suitable alkyl groups bonded to tin include, for example, linear or branched alkyl (i-Pr ($(CH_3)_2CH$—), t-Bu ($(CH_3)_3C$—), Me ($CH_3$—), n-Bu ($CH_3CH_2CH_2CH_2$—)), cyclo-alkyl (cyclo-propyl, cyclo-butyl, cyclo-pentyl), olefinic (alkenyl, aryl, allylic), or alkynyl groups, or combinations thereof. In further embodiments suitable R groups may include hydrocarbyl groups substituted with hetero-atom functional groups including cyano, thio, silyl, ether, keto, ester, or halogenated groups or combinations thereof.

The alkyl tin trialkoxide compositions can be represented by the formula)$RSn(OR^0)_3$. The alkyl tin trialkoxide can be synthesized from alkyl tin triamide, although other synthesis pathways can be used, such as those described in the '292 application wherein synthesis of monoalkyl tin trialkoxides is achieved from alkyl triamido tin compositions. The alkyl triamido tin compositions can be represented by the formula $RSn(NR''COR''')_3$. The R groups in the formulas for the alkyl tin trialkoxide and alkyl triamido tin compositions can be the same R groups as summarized above for the alkyl tin triamide compositions, and the corresponding discussion of these R groups above is as if copied in this paragraph in its entirety. The monoalkyl triamido tin compositions are not discussed further herein. For the alkoxide ligands —$OR^0$, the $R^0$ groups can be independently hydrocarbon groups with 1-10 carbon atoms, such as methyl groups, ethyl groups, or the like.

Polyalkyl tin impurity compositions may affect condensation of the coated resist material and contribute to radiation resist outgassing during lithographic processing, which increases the potential for tin contamination of equipment used for film deposition and patterning. Based on these concerns, a significant desire exists to reduce or eliminate the dialkyl or other polyalkyl components of resist compositions. The monoalkyl tin trialkoxide compositions can be desirable constituents in precursor patterning composition solutions since they are amenable to in situ hydrolysis and condensation to form monoalkyl tin oxo-hydroxo compositions with alcohol byproducts that are generally and appropriately volatile for removal commensurate with in situ hydrolysis. As described herein, contaminants from polyalkyl tin compounds are removed in a distillation of a monoalkyl tin triamide compositions, although direct purification of the monoalkyl tin trialkoxide compositions may be suitable to remove polyalkyl contaminants.

Monoalkyl tin triamide compositions can be directly synthesized with relatively low polyalkyl contaminants using any one of three methods summarized herein, and these methods are described in more detail in the '292 application. The purified monoalkyl tin triamides and the monoalkyl tin trialkoxides can have both low polyalkyl contamination and low non-tin metal contamination. Due to particularly effective purification of the monoalkyl tin trialkoxides relative to compounds with non-tin metals, the trialkoxides can be purified to very low metal contamination, as demonstrated in the Examples below. With respect to the polyalkyl tin contaminants, these trace metal concentrations can be reduced to undetectable levels.

The fractional distillation processes described herein can be effective to remove non-tin metal contaminants to a significant degree for monoalkyl tin triamides and in particular for monoalkyl tin trialkoxides. Generally, the monoalkyl tin composition is diluted in an organic solvent for further processing, and these diluted solutions are suitable for analysis with ICP-MS or ICP-AES techniques, as described further below, to obtain the metal concentrations down to low levels. The evaluation of the metal contamination as well as the formation of resist precursor formulations generally involves dilution with an organic solvent. With respect to evaluation of the metal contamination, the pure compositions are diluted to prevent saturation of the mass spectrometer detector by the high tin concentration. Suitable solvents can be used that do not contribute themselves to significant metal contaminants.

Monoalkyl tin triamides can be purified and dissolved in solvents to reduce each non-tin metal element to levels of no more than about 50 parts-per-billion (ppb) by mass, in further embodiments no more than about 40 ppb, in other embodiments no more than about 30 ppb, and in additional embodiments no more than about 25 ppb by mass. Solutions of monoalkyl tin trialkoxides can be purified to reduce each non-tin metal element to particularly low levels of no more than about 3 ppb, in further embodiments no more than about 2 ppb, and in other embodiments no more than about 1.5 ppb by mass. As seen in the examples below, the metal contaminant levels generally can be reduced for most non-tin metals to below the detection limit, generally less than 1 ppb. For the monoalkyl tin trialkoxide exemplified below, of 23 non-tin elements, only barium was measured slightly above the detection limit, while still being below 1 ppb. A person of ordinary skill in the art will recognize that additional ranges of non-tin metal purification within the explicit ranges above are contemplated and are within the present disclosure.

The resist precursor composition can be conveniently specified based on tin ion molar concentration. The resist precursor compositions can have the values of low non-tin metal contamination as specified in the previous paragraph. In general, the resist precursor solution generally comprises from about 0.0025 M to about 1.4 M tin cation, in some embodiments from about 0.004M to about 1M, in further embodiments from about 0.005 M to about 0.75 M, also in some embodiments from about 0.01M to about 1M, and in additional embodiments from about 0.01 M to about 0.5 M tin cation. A person of ordinary skill in the art will recognize that additional concentration ranges and values within the explicit ranges above are contemplated and are within the present disclosure.

The non-tin metal contaminants can be evaluated using standard analytical techniques, in particular inductively coupled plasma-mass spectrometry (ICP-MS) and/or inductively coupled plasma-atomic emission spectrometry (ICP-AES). These techniques can measure metals to very low levels. As indicated in the Examples, measurements were made at a commercial analytical testing facility. For handling the samples and introduction of the samples into the analytical equipment, the samples are diluted with solvent. Suitable solvents are described below for the formation of resist precursor coating solutions, and in the examples, 4-methyl-2-pentanol was used as the solvent. Semiconductor grade solvents with metal contamination levels in the parts per trillion are commercially available from Alfa Aesar, Fuji Film, KMG Chemicals (TX, USA), TOK America, Inc., Honeywell Electronic Materials, and other suppliers. Proper handling of the solutions and storage containers and dilution of the monoalkyl tin composition with a suitable semiconductor grade solvent having metal contamination in the parts per trillion range should not alter the measurement of the non-tin metal contaminants relative to the tin over a broad concentration range.

Ultra-pure solvents are commonly stored and transported in plastic containers made of high-density polyethylene (HDPE), polytetrafluoroethylene (PTFE), or polypropylene (PP). Aicello Corporation CLEANBARRIER™ (CB) bottles are constructed from HDPE and designed to store and transport pure semiconductor grade chemicals with low particle counts and low trace metal concentrations. Photoresists can also be stored in dealkalized glass bottles. Commercial containers are commonly made with soda-lime glass. This glass contains a high concentration of sodium, which solvents and liquids can leach from the glass. A process of dealkalization depletes sodium from the surface of a glass container to eliminate sodium leaching.

Also, the monoalkyl tin compositions can be filtered to eliminate particulate contaminants. An improved procedure for performing the filtering is described in detail below. The filtering and evaluation of the filtered composition is performed with a sample dissolved in solvent. The dilution is generally performed to the concentrations of the resist composition since the desired resist composition is filtered directly and then loaded into a container for storage and transport. Tin concentrations in resist precursor compositions are presented above.

The particulate contamination can be measured using particle measuring equipment. For example, for photoresists generally, Rion Corporation (Japan) sells particle counters based on light scattering, and such a particle counter is used in the Examples below. An appropriately selected particle counter can perform in line particle measurement by sampling a solution from a filtration flow system. The results from the particle measurements are presented in number of particles per milliliter (mL) of fluid. The particular particle counter would have selected ranges of particle size that are measured, and the results in the Examples below provide particle counts at sizes of 70 nm or larger.

The removal of particulates from organometallic photoresists is described in published PCT application WO 2017/163922 to Tsubaki et al. (hereinafter Tsubaki application), entitled (translated) "Active Ray-Sensitive or Radiation-Sensitive Composition, Method for Purifying Active Ray-Sensitive or Radiation-Sensitive Composition, Pattern-Forming Method, and Method for Producing Electronic Device," incorporated herein by reference. The filtering methods in the Tsubaki application were directed to various metal compounds with selected ligands, and exemplified butyl tin oxide hydroxide ($C_4H_9$—SnOOH) in Example 9. Tsubaki does not discuss filtering alkyl metal alkoxides. As described below, the filtration of alkyl metal alkoxides to remove particulates presents particular challenges.

Based on the filtration processes developed and described herein, resist compositions comprising monoalkyl metal trialkoxides and/or monoalkyl tin triamides in an organic solvent at a concentration from about 0.0025M to about 1.4 M and in some embodiments from about 0.01M to about 0.5 M (based on moles tin) can be purified to remove particulates such that the solutions have no more than about 3 particles per mL with average sizes greater than 150 nm, in further embodiments no more than about 2 particles/mL, and in additional embodiments no more than about 1 particle/mL with average sizes greater than 150 nm as determined by light scattering. Using commercially available particle counters, such as a Rion KS-41B Liquid-Borne Particle Sensor with optional capabilities, particles can be counted down to 70 nm using light scattering. Using filtration techniques herein, alkyl metal alkoxides in organic solvents with concentrations from 0.025M to 1.4M and in some embodiments from about 0.05M to about 0.5 M (based on moles tin) can be purified to have particle contaminants of no more than 25 particles/mL for particle sizes between 70 nm and 150 nm, in further embodiments no more than 20 particles/mL, and in additional embodiments no more than 12 particles/mL. A person of ordinary skill in the art will recognize that additional ranges of particle contamination within the explicit ranges above are contemplated and are within the present disclosure. These compositions can be purified also with respect to lowering metal contamination and polyalkyl metal contaminants using the processing described herein to produce resist compositions simultaneously with low metal contamination, low polyalkyl metal contamination, and low particulate contamination, especially monoalkyl tin trialkoxide compositions.

In general, the synthesis processes for preparing monoalkyl tin triamides comprise reacting a compound having an alkyl donating group, also described as an alkylating agent, with a tin tetraamide. Desirable results have been achieved in which the alkylating agent may be a Grignard reagent, a diorganozinc reagent, or a mono-organozinc amide. These syntheses can directly produce the monoalkyl tin triamides with low polyalkyl contaminants that can be used for forming resists or that can be additionally purified to reduce the polyalkyl contaminant levels even further. The methods with Zn reagents were specifically developed for synthesis of pure monoalkyl tin triamides containing secondary alkyl groups. In the synthesis methods, the alkylating agent selectively replaces an amide group of tin tetraamide with the alkyl group with improved selectivity and yield of monoalkyl tin triamides. Thus, in some embodiments, the reaction selectively produces monoalkyl tin triamide with low polyalkyl tin contaminants, particularly low dialkyl tin contaminants. The methods are especially useful for branched alkyl systems. The monoalkyl tin triamides with low polyalkyl contaminants can then be used to form monoalkyl tin trialkoxides with low polyalkyl contaminants.

For the reactions to form the monoalkyl tin triamide compounds, the tin tetraamide compounds can be obtained commercially or synthesized using known techniques. For example, tetrakis(dimethylamido)tin, $Sn(NMe_2)_4$, is available from Sigma-Aldrich. For the synthesis of the monoalkyl tin compositions, the tin tetraamide reactant in solution generally can have a concentration of between about 0.025 M and about 1.5 M, in further embodiments between about 0.05 M and about 1 M, or in additional embodiments between about 0.1 M and 0.75 M. A person of ordinary skill in the art will recognize that additional ranges of reactant concentrations within the explicit ranges above are contemplated and are within the present disclosure. In general, the relevant reactions to introduce an alkyl ligand to Sn can be initiated with the tin tetraamides in solution in a reactor under inert gas purge and in the dark. In alternative embodiments, some or all of the tin tetraamide reactant is added gradually, in which case the concentrations above may not be directly relevant since higher concentrations in the gradually added solution may be appropriate and the concentrations in the reactor may be transient.

The alkylating agent generally is added in an amount relatively close to a stoichiometric amount. In other words, the alkylating agent is added to provide the molar equivalent of one alkyl group for one tin atom. If an alkylating agent can provide multiple alkyl groups, such as the diorganozinc compounds that can donate two alkyl groups per zinc atom, then the stoichiometric amount of the alkylating agent is adjusted accordingly to provide about one alkyl group for each Sn. So, for diorganozinc compounds on the order of one mole of Zn is required per two moles of Sn. The amount of the alkylating agent can be about ±25%, about ±20%, or about ±15% relative to the stoichiometric amount of the reagent, or in other words the stoichiometric amount of the reagent + or − a selected amount to achieve desired process performance. A person of ordinary skill in the art will recognize that additional ranges of relative amount of alkylating agent within the explicit ranges above are contemplated and are within the present disclosure.

The alkylating agent dissolved in organic solvent can be added gradually to the reactor, such as dropwise or flowed at a suitable rate to control the reaction. The rate of addition can be adjusted to control the reaction process, such as over the course of time between about 1 minute to about 2 hours and in further embodiments from about 10 minutes to about 90 minutes. The concentration of alkylating agent in the addition solution can be adjusted within reasonable values in view of the rate of addition. In principle, the alkylating reagent can start in the reactor with the gradual addition of the tin tetraamide. A person of ordinary skill in the art will recognize that additional ranges of alkylating agents and additional times within the explicit ranges above are contemplated and are within the scope of the present disclosure.

The reaction to introduce the alkyl ligand to the tin atom may be conducted in a low oxygen, substantially oxygen free, or an oxygen-free environment, and an active inert gas purge can provide the appropriate atmosphere, such as an anhydrous nitrogen purge or an argon purge. In some embodiments, an additive, such as a neutral coordinating base, can be used during the reaction to hinder formation of undesired polyalkyl species. The following additives have been observed to reduce addition of a second alkyl group to tin: pyridine, 2,6-lutidine, 2,4-lutidine, 4-dimethylaminopyridine, 2-dimethylamino pyridine, triphenylphosphine, tributylphosphine, trimethylphosphine, 1,2-dimethoxyethane, 1,4-dioxane, and 1,3-dioxane. Other neutral coordinating bases may function in the same way. The reaction can optionally further comprise from about 0.25 to about 4 moles of neutral coordinating base per mole of tin. The reaction can be shielded from light during the reaction. The reaction may be conducted in an organic solvent, for example, an alkane (such as pentane or hexane), an aromatic hydrocarbon (such as toluene), ether (such as diethyl ether, $C_2H_5OC_2H_5$), or mixtures thereof. The solvent may be anhydrous to avoid reaction with water. The reaction generally is run for about 15 minutes to about 24 hours, in further embodiments from about 30 minutes to about 18 hours and in additional embodiments from about 45 minutes to about 15 hours. The temperature during the reaction may be between about −100° C. and about 100° C., in further embodiments between about −75° C. and about 75° C., and in additional embodiments between about −60° C. and about 60° C. Cooling or heating can be used to control the reaction temperature within the desired range, and control of the rate of reactant addition can also be used to influence temperature evolution during the course of reaction. The product monoalkyl tin triamide generally is an oil that can be purified using vacuum distillation, as discussed further below. Typical yields have been observed to be approximately 50 to 85 percent. A person of ordinary skill in the art will recognize that additional ranges of concentrations and process conditions within the explicit ranges above are contemplated and are within the present disclosure.

In some embodiments, the alkylating agent can be a Grignard reagent, a diorganozinc reagent, or a mono-organozinc amide. A Grignard reagent can be an organomagnesium halide. Specifically, a Grignard reagent in the described reaction may be RMgX, where X is a halide, generally Cl, Br, or I. Correspondingly, the diorganozinc reagent may be $R^2Zn$. In further embodiments the alkylating agent is a mono-organozinc amide ($RZnNR'_2$), where R' is an alkyl or cycloalkyl group, which can be substituted with a hetero-atom, and in some embodiments, R' may have between 1 and 8 carbon atoms. R may be an alkyl or cycloalkyl and have between 1 and 31 carbon atoms, and generally R can be described more fully as above with respect to the R moiety of the product compositions, which is as if incorporated for this discussion in its entirety. For example, the alkyl or cycloalkyl may be branched, can comprise aromatic groups and/or may have one or more heteroatom functional groups containing atoms such as O, N, Si, Ge, Sn, and/or a halogen. Grignard reagents are available commercially or can be synthesized using known methods. Commercial sources include American Elements Company, Sigma-Aldrich, and many other suppliers.

Diorganozinc compounds are available commercially or can be synthesized using known techniques. Commercial sources include, for example, Alfa Aesar, Sigma-Aldrich, Rieke Metals (Nebraska, USA) and Triveni Chemicals (India). The mono-organozinc amides can be synthesized, for example, from an alkyl zinc halide (RZnX, X=I, Br, Cl) and lithium amide ($LiNR'_2$), which are commercially available reagents from Sigma-Aldrich.

As noted above, the monoalkyl tin triamides can also be used to synthesize corresponding monoalkyl tin trialkoxides, although the monoalkyl tin trialkoxides can be synthesized using other approaches. In particular, monoalkyl tin trialkoxides can be produced by reacting the corresponding monoalkyl tin triamide with an alcohol in a non-aqueous solvent containing a base. The low polyalkyl tin contaminants in the monoalkyl tin triamides using the processing described herein can be carried forward into the product monoalkyl tin trialkoxides, so that the product monoalkyl tin trialkoxides have low dialkyl tin contaminants essentially at the mole percentages described above. Suitable organic solvents include, for example, an alkane (such as pentane or hexane), an aromatic hydrocarbon (such as toluene), ether (such as diethyl ether, $C_2H_5OC_2H_5$), or mixtures thereof. The alcohol is selected to provide the desired alkoxide group such that an alcohol ROH introduces the —OR group as the ligand attached to tin. A list of suitable R groups is provided above and correspondingly relate to the alcohol. Examples are provided below with t-amyl alcohol, but other alcohols can be similarly used to provide the desired —OR alkoxide ligand.

For the reaction of the triamide to form monoalkyl tin trialkoxide, the alcohol can be provided roughly in a stoichiometric amount. Since the alcohol is used to replace three amide groups, three mole equivalents of alcohol would be a stoichiometric amount. In general, the amount of alcohol can be at least about –5% stoichiometric equivalents and in further embodiments at least about a stoichiometric equivalent, and a large excess of alcohol can be used. To facilitate purification of the product alkyl tin trialkoxide, a tetradentate coordination ligand or chelating agent can be added to coordinate with unreacted species to form complexes that do not vaporize during distillation. For example, tris(2-amino-ethyl)amine (TREN), triethylenetetraamine (trien), or other tetradentate non-planar chelating agent can be used to complex with the unreacted species to facilitate purification. The chelating agent can be added at a selected time from the start of the reaction to any time prior to performing the distillation, in an amount from about 0.5 mole % to about 15 mole % and in further embodiments from about 1.0 mole % to about 10 mole % relative to the tin molar quantity. A person of ordinary skill in the art will recognize that additional ranges of reactant amounts within the explicit ranges above are contemplated and are within the present disclosure. If desired, a fractional distillation can be performed to further purify the monoalkyl tin trialkoxides from polyalkyl contaminants.

The monoalkyl tin triamides and the monoalkyl tin trialkoxides produced using the methods described above or other methods not explicitly described herein can be further purified using fractional distillation. It has been discovered that fractional distillation can be effective to reduce both metal contamination as well as contamination from other tin compounds, such as polyalkyl tin compounds. Thus, the product monoalkyl tin compositions can be appropriately processed with fractional distillation to achieve valuable purification for photoresist use. To provide for appropriate temperature ranges, the fractional distillation can be performed under significantly reduced pressures, and appropriate fractionation can be useful to reduce contaminants. In particular, initial fractions can be discarded and/or a portion of the composition can be left remaining in the initial distillation container. This fractionation can decrease higher boiling point and lower boiling point components with a modest reduction of yield while achieving a higher purity of the product.

An example of a fractional distillation apparatus is shown schematically in FIG. 1. Fractional distillation apparatus 100 comprises a distillation container 102, such as a round bottom flask, a heating element 104, such as a heating mantle or oil bath, distillation column 106, pump 108, pressure tubing 110 connecting pump 108 to the distillation system to maintain the system at a selected pressure, a pressure sensor 112 can be used to monitor the pressure, temperature sensor 114, such as a thermometer can be used to monitor the temperature in the distillation column, condenser 116 can collect vapor coming off the distillation column 106, and collection system 118 can collect purified liquid coming off of the condenser. Collection system 118 can comprise a rotatable cow joint 122 with three receiver connectors 124, 126, 128 that connect to three collection flasks 130, 132, 134, such as Schlenk bomb flasks. Collection flasks 130, 132, 134 can be rotated to position a selected flask for collection. The rotatable cow joint 122 can further comprise valves. The configuration can be adapted for a different number of collection flasks, such as two, four or more. The volume of distillation container 102 can be selected to be a suitable size for the amount of product to be purified, and heating element 104 can be configured to efficiently heat distillation container 102. Condenser 116 can be cooled with circulating water or other coolant. Suitable components for fractional distillation apparatus 100 are available commercially.

To reduce the temperature of the distillation process, the pressure can be reduced, for example, to a pressure from about 0.01 Torr to about 10 Torr, in further embodiments from about 0.025 Torr to about 5 Torr, and in further embodiments from about 0.05 Torr to about 2.5 Torr. A person of ordinary skill in the art will recognize that additional ranges of pressures within the explicit ranges above are contemplated and are within the present disclosure. A suitable fractional distillation column can be used with a volume suitable for the process, and these are commercially available. Fractional distillation columns include surfaces for condensation and re-vaporization along the column. Thus, in some embodiments, a column can be, for example, filled with a suitable inert packing material, such as Pro-Pak® distillation packing from Sigma (316SS), or it can be a Vigreux column with glass fingers extending into the vapor space. The column may or may not be insulated, and the thermal gradient along the column can be adjusted by the length of the column, insulation of the column, and the ambient temperature.

The temperature can be controlled in the vessel holding the material to be purified and along the column to achieve the desired separation. The thermal conditions for one embodiment are presented in the Examples below for both a monoalkyl tin triamide and a monoalkyl tin trialkoxide, and these conditions can be readily generalized for other compositions based on the teachings herein. For the distillation, the temperature of the heating bath can generally be set from about 50° C. to about 180° C. and in further embodiments from about 65° C. to about 150° C. A person or ordinary skill in the art will recognize that additional ranges of temperature within the explicit ranges above are contemplated and are within the present disclosure. If the non-tin metal compositions and the polyalkyl tin contaminants have a significantly higher or lower boiling point than the monoalkyl tin triamides or the monoalkyl tin trialkoxides, the other metals as well as the polyalkyl tin compositions can be separated away during the distillation process to produce the purified monoalkyl tin compositions. TREN or a similar tertadentate non-planar chelating agent as noted above is added to the distillation flask to complex impurity species that otherwise co-distill with the desired monoalkyl tin compositions. Moreover, fractions can be taken with selected volumes of liquid removed in each fraction during stages of the fractional distillation. The Examples demonstrate good separation with reasonable yield free from detectable contaminants.

For particular removal of contaminants with lower boiling point, these contaminants can be separated away by collecting and discarding an initial fraction during the distillation process. In some embodiments, the discarded initial fractions optionally can include at least the initial 0.1 vol %, in further embodiments at least the initial 0.5 vol %, in other embodiments, at least the initial 1 vol % and in additional embodiments from about 1 vol % to about 20 vol % can be discarded relative to the initial volume charged into the distillation vessel. In the examples below, a highly purified product was obtained without discarding any initial fractions. In some sense, the keeping of a fraction of the distillation material in the distillation flask has been found to be more significant for the purification process. Additionally or alternatively, to remove higher boiling contaminants, a fraction of the initial composition can be left remaining in the distillation vessel. In some embodiments, the amount of composition left remaining in the distillation vessel can be at least about 0.5 vol %, in further embodiments at least about 1 vol %, in other embodiments at least about 3 vol %, and in additional embodiments from about 1 vol % to about 30 vol % for purification of the monoalkyl tin triamides, and, for purification of the monoalkyl tin trialkoxides, at least about 0.5 vol %, in further embodiments from about 0.75 vol % to about 12 vol %, and in other embodiments from about 1 vol % to 10 vol %. A person of ordinary skill in the art will recognize that additional ranges of fractionation within the explicit ranges above are contemplated and are within the present disclosure.

In general, there may be a tradeoff of purity versus yield in the selection of the amount of initial collection fractions to discard and the amount of initial composition to leave remaining the distillation vessel. Depending on the boiling point differences relative to contaminants as well as the purity of the initial composition prior to fractional distillation, the addition of a tetradentate chelating agent and control of the fractional distillation process can assist with improving yield within the constraints of the compositions. Of course, if contaminants copurify with the desired compositions due to close similarities of the boiling points, the fractional distillation may not achieve the desired purification. It has been found that desirable monoalkyl tin triamides and, in particular, monoalkyl tin trialkoxides can be produced with metal contaminants reduced to very low levels, which is presumed to be related to the relative boiling points of metal contaminants and their complex formation with a tetradentate chelating agent such as TREN.

Further processing of the purified monoalkyl tin compositions generally involves dilution of the compositions with an organic solvent. The diluted compositions can be used to carry out further reactions, such as the reaction of the monoalkyl tin triamides to form monoalkyl tin trialkoxides, or to form a resist coating. The diluted compositions can be filtered to remove particulates. The filtering can be performed at one or more suitable process points, such as prior to use in a further reaction, prior to placement of a resist composition into a container for storage and/or transport, and/or in a process line via delivery on a commercial wafer track. Improved processing is described herein, which is especially useful for filtering monoalkyl tin trialkoxides.

If configured appropriately, a single filtration can in principle achieve desired low particulate levels. In some embodiments, the filtering apparatus can be configured for performing repeated filtering of the organometallic composition, such as by configuring the system for recirculation and/or for performing serial filtration. For recirculation of the filtered composition, the container can be fitted with a drain port and a return fill port. A pump or pumps can be used to drive the flow of fluid through the filtration system, and a suitable filter can be used in line to remove small particulates from the fluid. Clean tubing can be used to connect the system with flow between the respective components.

Figure 2:
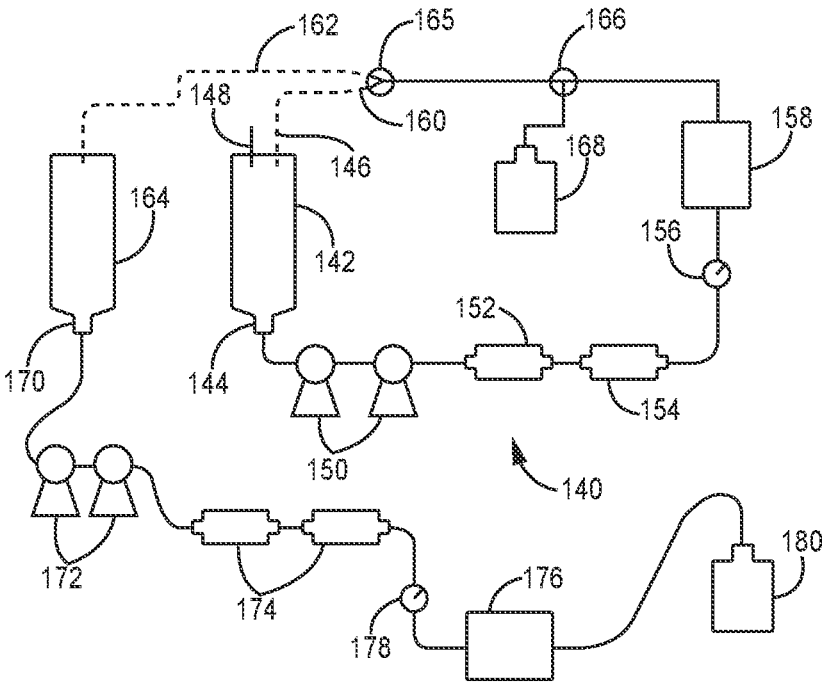
FIG. 2 is a schematic view of a filtration apparatus suitable for removal of fine particulates from monoalkyl tin compositions.

A schematic layout of a filtration system 140 is shown in FIG. 2. The composition to be filtered can be in a container 142 with an outlet 144, an inlet 146 and access port(s) 148. Flow from outlet can be controlled with one or more pumps 150. The flow path then passes through a first filter 152 and optionally additional filter(s) 154. A flow meter 156 can be used to monitor the flow rate through the system. A particle analyzer 158 can be configured to measure particle within the filtered flow. While FIG. 2 shows particle analyzer 158 in line with the flow, other suitable configurations can be used, such as a sampling configuration. Filtered flow can be directed for recirculation through recirculation line 160 connected to inlet 146 of container 142 or for collection through collection line 162 directed to collection container 164. A valve 165 can be used to selectively direct flow to either recirculation line 160 or collection line 162. In some embodiments, valve 166 can be used to divert filtered flow to collection container 168, such as in a recirculation configuration when the particle count drops below a selected value. Flow can be directed through suitable tubing, such as polymer tubing.

Fluid in collection container 164 can be further filtered if desired in either a recirculation configuration or another serial filtering configuration. A recirculation configuration for collection container 164 can be conceived by conceptually reproducing the circular flow loop connected to container 142 comprising pump(s), filter(s), particle analyzer, and other desired components, with these components specifically connected to collection container 164. As depicted in FIG. 2, a second serial filtration configuration is shown. Flow from outlet 170 of collection container 164 can be controlled with one or more pumps 172 that direct flow to one or more filters 174. Flow from filter(s) 174 can be directed past a particle analyzer 176 that can be in line or in a sampling configuration, and a flow meter 178, positioned at a convenient location along the flow path. Filtered flow can be collected in bottle 180. Again, suitable polymer tubing or other suitable flow conduits can be used to direct the flow through the filtration system. Further serial filtering and/or combinations with recirculation and serial filtering can be performed if desired through a repeat of the filtration system. In a filtration system with two or more stages, the filters used for a later stage filtration can be selected to have a finer particle removal capability. For example, a first stage filtration can be performed with a filter rated at a particle size cut off of 5 nm to 15 nm, and a second stage filtration can be performed with a filter rated at a particle size cut off of 1 nm to 3 nm. In some embodiments, the first stage filtration can involve recirculation, while a second stage is serial.

For embodiments in which the container is configured in a closed loop configuration to provide for the recirculation, a lid to the container providing the composition to be filtered can be configured with a plurality of ports. One port can be used for removal of the fluid to be pumped to the filter, another port can be used to deliver the filtered fluid back into the container, and other ports can be used for various additional functions. For example, another port of the container lid can be used to deliver the filtered fluid to a packing container. A specific embodiment of a filtering apparatus is described in more detail in the Examples below.

While generally any one of a variety of pumps can be used to drive the filtration flow, it has been discovered that impeller style pumps provide surprisingly improved filtration performance. While not wanting to be limited by theory, the more even pressures delivered by an impeller style pump are believed to improve the performance of the filter for particulate removal by reducing pressure fluctuations. The improved filtering is confirmed in the Examples where filtering with an impeller style pump is contrasted with a diaphragm style pump using the same filter. Suitable impeller style pumps include in particular magnetic levitation impeller pumps from Levitronix® GmbH (Switzerland). Due to the high viscosity of the monoalkyl tin trialkoxides, two or more Levitronix® pumps can be placed in series to obtain a desired flow rate. The magnetic levitation pumps provide low shear on the liquid during pumping as well as a steady pressure. Flow rates through the system generally depend on the filter selection, pump selection, tubing size, temperature, and pressure, which is influenced by the fluid viscosity.

Filters suitable for resist compositions based on in-line filtering are commercially available. For example, photoresist filters are available from Entegris (e.g., Impact® line of filters) and Nippon Pall Co. Ltd (Japan, e.g. PE-Kleen filters and PhotoKlean™ DDF P-Nylon). The rated particle filtration size of the filter can be specified down to >5 nm, but the smaller pore sizes can reduce the flow rate. As described in the Examples, desirable performance is obtained with a filter rated with pore sizes <10 nm. In general, the particle filtration rating can be 50 nm (i.e., removing particles with sizes greater than 50 nm), 25 nm, 10 nm, 5 nm, 3 nm, 2 nm, or 1 nm. A person of ordinary skill in the art will recognize that additional ranges of particle filtration ratings within the explicit ranges above are contemplated and are within the present disclosure.

For particle removal, the purified monoalkyl tin composition after fractional distillation can be placed in a clean container equipped for pumping out the composition for filtration. Suitable filtration systems are summarized above. As noted above, various configurations can be used. For recirculation, the composition can be recirculated generally from once to 100 times, and in further embodiments from 2 to 40 times. For serial filtration, the composition can be serially filtered once to 10 times. A person of ordinary skill in the art will recognize that additional ranges of numbers of filtration steps within the explicit ranges above are contemplated and are within the present disclosure. The filtration can be performed prior to placing the radiation resist composition into a container for shipping and/or in a production line immediately prior to use of the composition for patterning purposes. In any case, the filtration system can be configured to avoid contamination of the radiation resist composition with metal contaminants and/or particulate contaminants. If the filtered compositions are placed in containers for shipping, the containers can be sealed and appropriately shipped to end use facilities, at which appropriately clean processing can be used for transfer of the compositions into process equipment.

EXAMPLES

Example 1. Preparation and Purification of Alkoxide Precursor from Amide

This example demonstrates the synthesis and purification of monoalkyl tin trialkoxides from a monoalkyl tin triamide precursor. The synthesis and purification of the triamide is demonstrated first.

Figure 3:
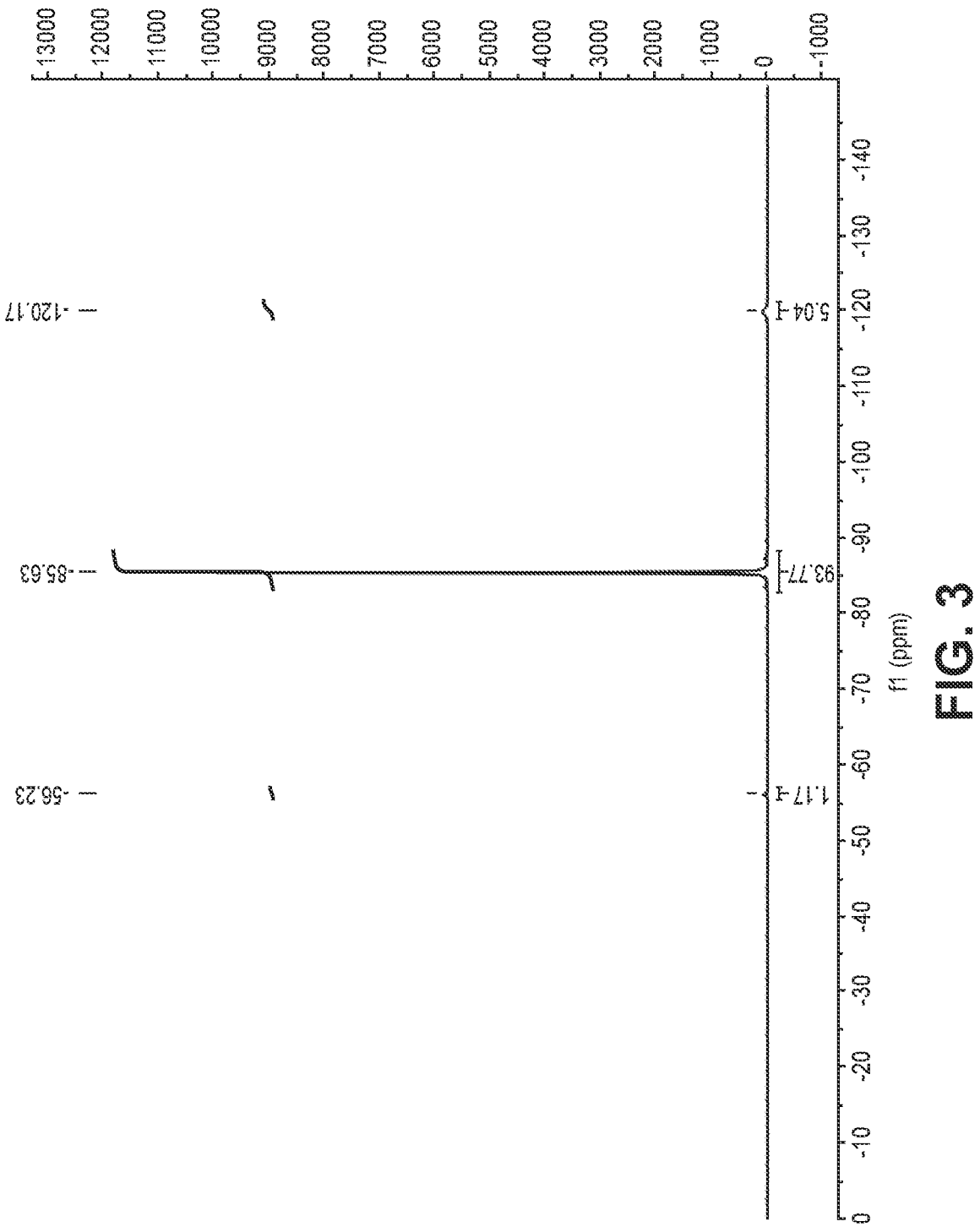
FIG. 3 is a $^{119}$Sn NMR spectrum of a t-BuSn(NMe$_2$)$_3$ sample as synthesized, where t-Bu represents a tertiary butyl ligand and NMe$_2$ represents a dimethylamide ligand.

Part A: Synthesis and purification of t-BuSn(NMe$_2$)$_3$ Precursor t-BuSn(NMe$_2$)$_3$ was prepared by reaction of t-BuMgCl and Sn(NMe$_2$)$_4$ in diethyl ether; t-BuMgCl (2.0 M) and Sn(NMe$_2$)$_4$ (99.9% trace metals basis) were supplied by Sigma Aldrich. In the reaction, the t-butyl group from the Grignard reagent substitutes for one dimethyl amide (—N(CH$_3$)$_2$) group. The $^{119}$Sn NMR spectrum in FIG. 3 shows the approximate molecular purity of the product t-BuSn(NMe$_2$)$_3$ ($\delta$=−85.6 ppm) to be 94%, as determined by peak integration; 1% is (t-Bu)$_2$Sn(NMe$_2$)$_2$ ($\delta$=−56.2 ppm), and the remaining 5% is Sn(NMe$_2$)$_4$ ($\delta$=−120.2 ppm).

In a glovebox filled with Ar(g) and <0.5 ppm O$_2$(g), 1202.57 g of t-BuSn(NMe$_2$)$_3$ were charged into a two-neck 2-L round bottom flask with a 1.25-inch egg-shaped stir bar. A 34.3 g (6 mol %) quantity of tris(2-aminoethyl)amine (TREN, Alfa Aesar) was added to the flask and stirred, forming a milky white suspension. One neck of the 2-L flask was equipped with a Teflon valve and the other sealed with a 24/40 glass stopper. The flask was removed from the glovebox and connected to a Schlenk line.

Purification was performed using the following packed column distillation setup:

Heidolph Hei-Tec stir plate with Pt/1000 RTD probe and temperature feedback control.

Silicone oil bath.

300-mm vacuum jacketed 24/40 Hempel style distillation column (Sigma Aldrich)

0.24-in 316 stainless steel saddle mesh column packing (Ace-Glass)

Vacuum jacketed 24/40 short-path distillation head with water-cooled condenser. (Chemglass)

1-L Schlenk bomb as collection flask

Figure 4:
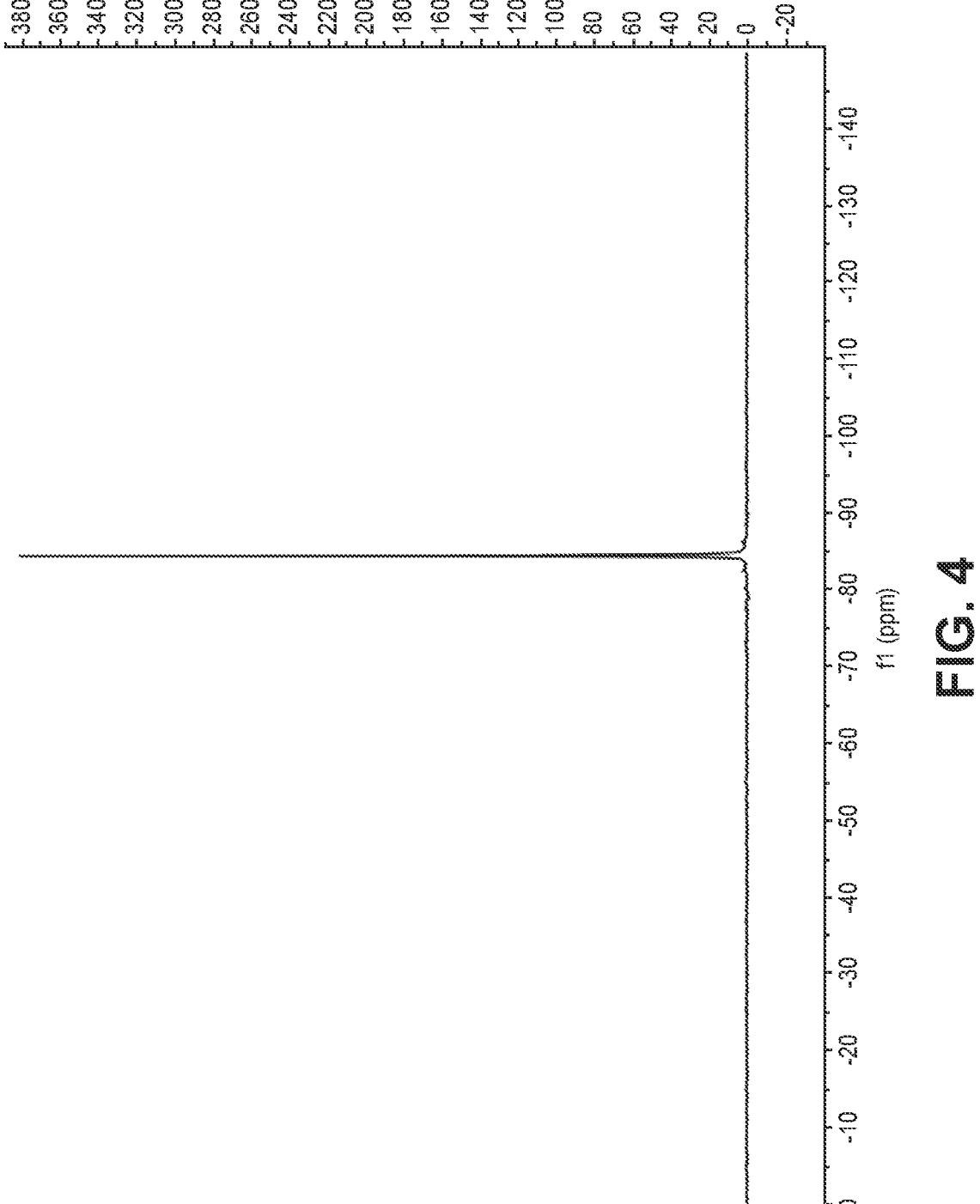
FIG. 4 is a $^{119}$Sn NMR spectrum of the t-BuSn(NMe$_2$)$_3$ sample used to obtain the spectrum of FIG. 3 following purification by fractional distillation.

The vacuum distillation was carried out using an oil bath temperature between 115° C. and 120° C. and an absolute pressure of approximately 500 mTorr, resulting in a distillate vapor temperature in the range of 58-62° C. No initial distillate was discarded and 872.6 g of purified t-BuSn(NMe$_2$)$_3$ was recovered, resulting in a yield of 77.2%. At the end of the distillation approximately 275 grams of material are retained in the distillation flask and the packed column. It should be noted that the presence of TREN effectively retains the unreacted Sn(NMe$_2$)$_4$ and the (t-Bu)$_2$Sn(NMe$_2$)$_2$ impurity in the distillation flask. The $^{119}$Sn NMR spectrum in FIG. 4, showing a single peak at $\delta$=−85.6 ppm, confirms isolation of a pure product.

To evaluate the non-tin metal contaminants of the distilled t-BuSn(NMe$_2$)$_3$, a sample of the triamide was diluted with 2-methyl 2-butanol to a tin concentration of about 0.05M with respect to Sn concentration. The product was subjected to elemental analysis using Inductively Coupled Plasma—mass spectroscopy (ICP-MS) and/or Inductively Coupled Plasma—atomic emission spectroscopy (ICP-AES) at ChemTrace (CA, USA). The measurements were performed in triplicate. The results for 23 elements are presented in Table 1.

TABLE 1

| Trace Metals Analytical Results | | | | | |
|---|---|---|---|---|---|
| | | | Concentration in ppb | | |
| | | Detection Limits | 1 | 2 | 3 |
| 1. Aluminum | (Al) | 0.7 | 1.5 | 2.0 | 1.1 |
| 2. Arsenic | (As) | 0.7 | <0.7 | <0.7 | <0.7 |

TABLE 1-continued

| | | | Concentration in ppb | | |
| | | Detection Limits | 1 | 2 | 3 |
| --- | --- | --- | --- | --- | --- |
| 3. Barium | (Ba) | 0.5 | 0.87 | <0.5 | 0.57 |
| 4. Cadmium | (Cd) | 0.5 | <0.5 | <0.5 | <0.5 |
| 5. Calcium | (Ca) | 0.7 | 3.4 | 3.3 | 4.6 |
| 6. Chromium | (Cr) | 0.5 | <0.5 | <0.5 | <0.5 |
| 7. Cobalt | (Co) | 0.5 | <0.5 | <0.5 | <0.5 |
| 8. Copper | (Cu) | 0.7 | 1.2 | 1.1 | 1.1 |
| 9. Gold | (Au) | 0.7 | <0.7 | <0.7 | <0.7 |
| 10. Iron | (Fe) | 0.7 | <0.7 | <0.7 | <0.7 |
| 11. Lead | (Pb) | 0.7 | <0.7 | <0.7 | <0.7 |
| 12. Lithium | (Li) | 0.5 | 1.5 | 1.1 | 3.4 |
| 13. Magnesium | (Mg) | 0.5 | 4.0 | 2.3 | 3.9 |
| 14. Manganese | (Mn) | 0.5 | <0.5 | <0.5 | <0.5 |
| 15. Nickel | (Ni) | 0.7 | <0.7 | <0.7 | <0.7 |
| 16. Palladium | (Pd) | 0.7 | <0.7 | <0.7 | <0.7 |
| 17. Potassium | (K) | 0.7 | <0.7 | <0.7 | <0.7 |
| 18. Silver | (Ag) | 0.7 | <0.7 | <0.7 | <0.7 |
| 19. Sodium | (Na) | 0.7 | 9.4 | 5.7 | 22 |
| 20. Titanium | (Ti) | 2 | <2 | <2 | <2 |
| 21. Tungsten | (W) | 0.5 | <0.5 | <0.5 | <0.5 |
| 22. Vanadium | (V) | 0.7 | <0.7 | <0.7 | <0.7 |
| 23. Zinc | (Zn) | 0.7 | 5.9 | 6.9 | 6.8 |

Note:
All elements were analyzed by ICP-MS/ICP-AES.

Part B: Conversion of t-BuSn(NMe$_2$)$_3$ to t-BuSn(OtAm)$_3$

In a glovebox filled with Ar(g) and <0.5 ppm O$_2$(g), the purified t-BuSn(NMe$_2$)$_3$ (2824 mmol) from Part A was charged into a two-neck 2-L round bottom flask equipped with a 1.25-inch egg-shaped stir bar. 772 g (8755 mmol) of anhydrous 2-methyl-2-butanol (Sigma Aldrich, >99%) were added to a two-neck 1-L round bottom flask. One neck of the flask was sealed with a 24/40 rubber septum and a Teflon valve attached to the other. The flask was then removed from the glovebox and connected to a Schlenk line. The t-BuSn (NMe$_2$)$_3$ flask was cooled in an isopropyl alcohol/dry ice bath (cryobath) before slowly adding the 2-methyl-2-buta-nol (t-Amyl alcohol) using a stainless steel 16-gauge can-nula and 1-2 psi of N$_2$(g) pressure. An 18-gauge needle was used as a vent for the reaction flask to allow the generated dimethylamine gas to escape. Once the addition was com-plete, the reaction flask was removed from the cryobath and allowed to warm to room temperature under N$_2$(g). After warming to room temperature, the septum was replaced with a 24/40 glass stopper and excess solvent was stripped under vacuum and discarded.

Figure 5:
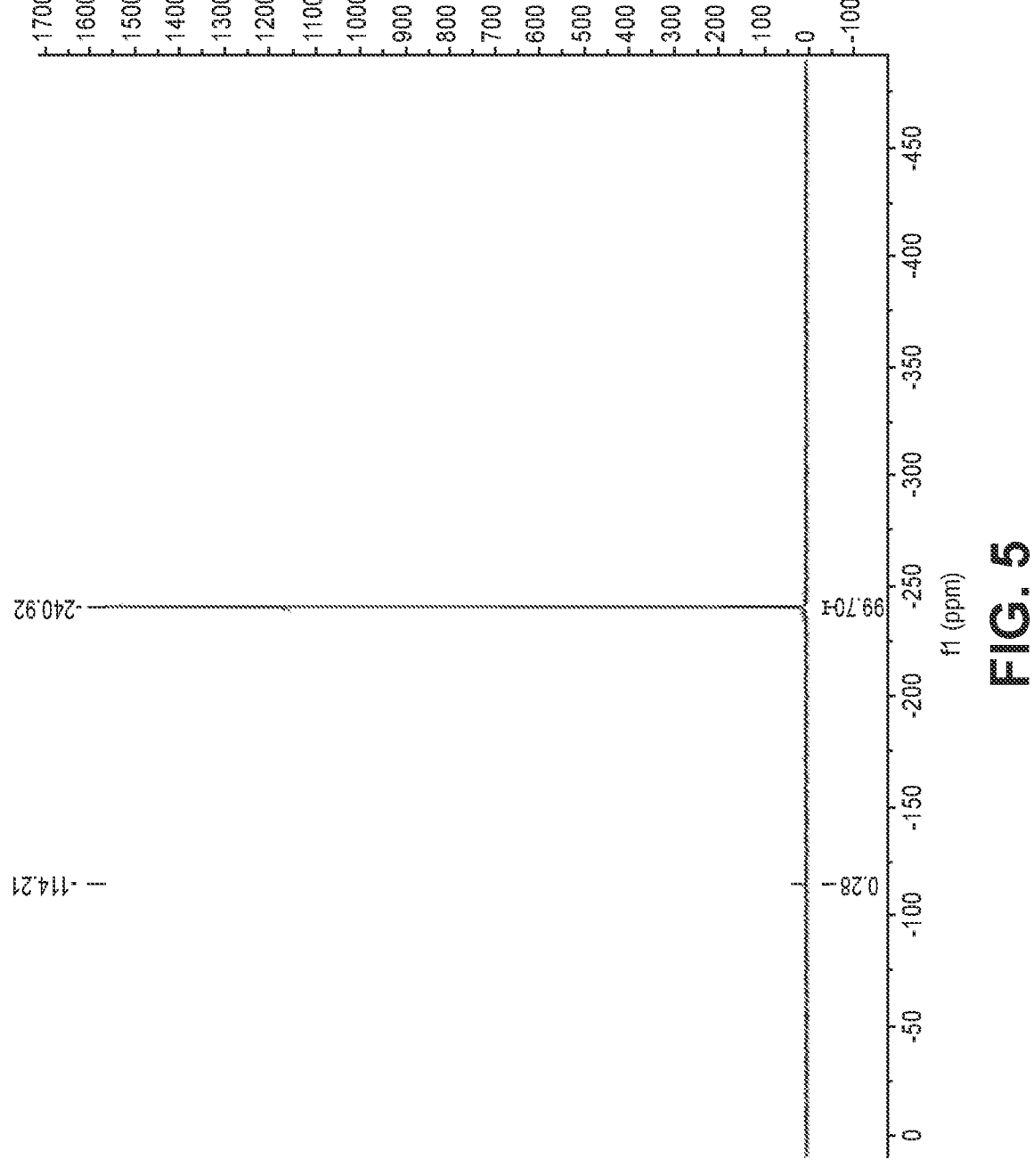
FIG. 5 is a $^{119}$Sn NMR spectrum of a t-BuSn(OtAm)$_3$ sample following purification by fractional distillation, where t-Bu represents a tertiary butyl ligand and OtAm represents a tertiary amyl ligand.

The product was then distilled under vacuum with a setup similar to that described in Part A, wherein a small 75-mm vacuum-jacketed Vigreux column replaced the large packed column. The distillation was carried out using an oil bath temperature of 155° C. and an absolute pressure near 500 mTorr, resulting in a distillate vapor temperature in the range 104-108° C. A 1201.68 g quantity of product was recovered resulting in a yield of 97.3% for this step. No initial distillate material is discarded. At the end of the distillation, approxi-mately 30 grams of material remains in the distillation flask. FIG. 5 shows the $^{119}$Sn NMR spectrum of the product. GC-MS analysis shows that it contains 0.28±0.1% (t-Bu)$_2$Sn(Ot-Am)$_2$ ($\delta$=−114.2 ppm) as a molecular impu-rity.

Example 2: Photoresist Formulation

This Example demonstrates the composition and charac-terization of a photoresist formulation.

A 1 M solution of t-BuSn(Ot-Am)$_3$ in 4-methyl-2-penta-nol (>99.5% purity) was initially prepared. Approximately one mole (437.225 g) of the alkoxide precursor from Example 1 was weighed and transferred inside a glovebox to a 1 L volumetric flask; 4-methyl-2-pentanol was then added to the flask. The solution was transferred to a fume hood, and additional 4-methyl-2-pentanol was added to bring the total volume to 1 L. The formulated resist was then transferred to a 1 L brown Aicello Corp. CLEANBARRIER™ (CB) bottle. The molarity was checked via calcination to SnO$_2$, confirm-ing a precursor concentration of 1.0 M. The formulation was then diluted in a 20-L NowPak™ container to a final volume of 20 L and a final concentration of 0.044 M. Table 2 summarizes the ICP analysis of this solution, performed by ChemTrace (Fremont, CA, USA).

TABLE 2

ICP Analysis of Photoresist formulation.
Trace Metals Analytical Results

| | | | Concentration in ppb | | |
| | | Detection Limits | 1 | 2 | 3 |
| --- | --- | --- | --- | --- | --- |
| 1. Aluminum | (Al) | 0.7 | <0.7 | <0.7 | <0.7 |
| 2. Arsenic | (As) | 0.7 | <0.7 | <0.7 | <0.7 |
| 3. Barium | (Ba) | 0.5 | 0.61 | 0.67 | 0.75 |
| 4. Cadmium | (Cd) | 0.5 | <0.5 | <0.5 | <0.5 |
| 5. Calcium | (Ca) | 0.7 | <0.7 | <0.7 | <0.7 |
| 6. Chromium | (Cr) | 0.5 | <0.5 | <0.5 | <0.5 |
| 7. Cobalt | (Co) | 0.5 | <0.5 | <0.5 | <0.5 |
| 8. Copper | (Cu) | 0.7 | <0.7 | <0.7 | <0.7 |
| 9. Gold | (Au) | 0.7 | <0.7 | <0.7 | <0.7 |
| 10. Iron | (Fe) | 0.7 | <0.7 | <0.7 | <0.7 |
| 11. Lead | (Pb) | 0.7 | <0.7 | <0.7 | <0.7 |
| 12. Lithium | (Li) | 0.5 | <0.5 | <0.5 | <0.5 |
| 13. Magnesium | (Mg) | 0.5 | <0.5 | <0.5 | <0.5 |
| 14. Manganese | (Mn) | 0.5 | <0.5 | <0.5 | <0.5 |
| 15. Nickel | (Ni) | 0.7 | <0.7 | <0.7 | <0.7 |
| 16. Palladium | (Pd) | 0.7 | <0.7 | <0.7 | <0.7 |
| 17. Potassium | (K) | 0.7 | <0.7 | <0.7 | <0.7 |
| 18. Silver | (Ag) | 0.7 | <0.7 | <0.7 | <0.7 |
| 19. Sodium | (Na) | 0.7 | <0.7 | <0.7 | <0.7 |
| 20. Titanium | (Ti) | 2 | <2 | <2 | <2 |
| 21. Tungsten | (W) | 0.5 | <0.5 | <0.5 | <0.5 |
| 22. Vanadium | (V) | 0.7 | <0.7 | <0.7 | <0.7 |
| 23. Zinc | (Zn) | 0.7 | <0.7 | <0.7 | <0.7 |

Note:
All elements were analyzed by ICP-MS/ICP-AES.

In Table 2, the values marked with "<" symbols indicate that the concentration for these metals was below the detection limit. Thus, for all of the metals examined, only Ba was above the detection limit, and for this metal the mea-sured values were below 1 ppb. It can reasonably be assumed that for the other metals not directly measured that their concentrations will be comparable to the measured values in Table 2 based on the relative natural abundances of the metals.

Example 3. Photoresist Formulation Particle Count

The following example demonstrates and compares the filtration of the photoresist solutions to remove particulates with impeller and diaphragm style pumps.

Part A: Impeller Pump.

Figure 6:
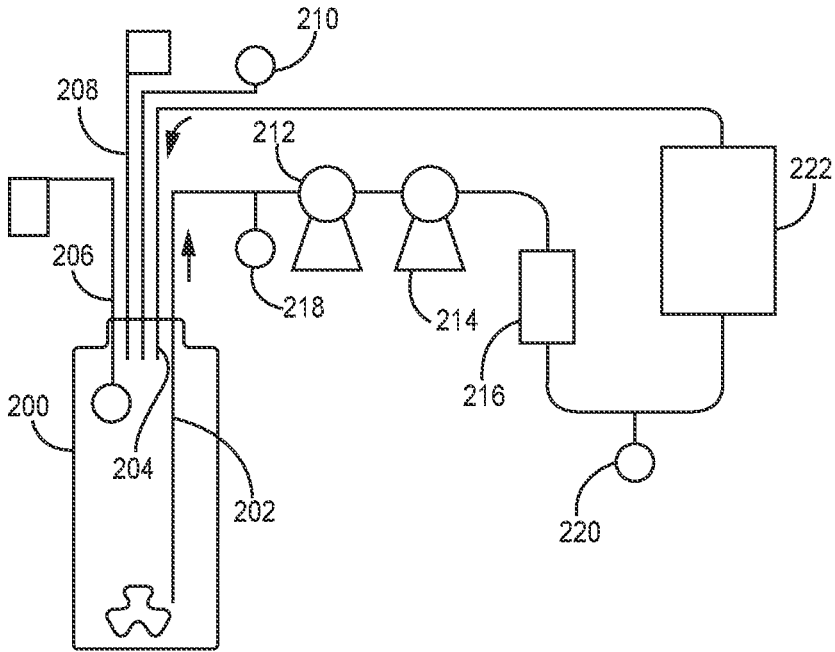
FIG. 6 is a schematic view of a specific exemplified filtration system.

Filtration of the alkoxide solution began immediately after dilution. The filtration system is shown schematically in FIG. 6. The mixing tank system 200 contains 5 connection ports at the top of the tank. These ports allow for the following: filtration via recirculation (ports 202, 204), tank cleaning via spray ball (port 206), argon injection (port 208), and headspace pressure monitoring (port 210). The filtration loop consists of two magnetic levitation impeller pumps 212, 214 in series, a temperature probe, a 5-nm Entegris UHP filter 216, pressure transducers before 218 and after 220 the filter, and a particle counting manifold 222. Suitable clean tubing connects the components.

The solution was recirculated for one day to achieve 17 volumetric turnovers through the filter. Particle counts were monitored during filtration with a RION KS-41B laser system, which includes a syringe sampler (KZ-31W) and controller (KE-40B1). The system quantifies particle counts in select channel sizes via light scattering methods to sizes as small as 70 nm. The final, filtered material was bottled in a laminar flow hood into Aicello GB bottles.

Particle counts for the 70, 150, and 200 nm channels are 3.80, 0.24, and 0.12 per mL, respectively. Table 4 summarizes counts at all channels.

Comparison of the data in Table 3 with that in Table 4 shows that filtration with the impeller pump was more effective than the diaphragm pump for removal of particles at all sizes measured.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

TABLE 3

| | Channel Size | | | | | | | | | |
| --- | --- | --- | --- | --- | --- | --- | --- | --- | --- | --- |
| | 70 nm | 80 nm | 90 nm | 100 nm | 150 nm | 200 nm | 250 nm | 300 nm | 400 nm | 500 nm |
| Particles/mL | 3.8 | 1.44 | 0.92 | 0.68 | 0.24 | 0.12 | 0.08 | 0 | 0 | 0 |

The filtration using the impeller pump was very effective at removal of particulates down to small sizes. The filtration results were notably improved over the equivalent filtration using the diaphragm pump, as described above using a comparable system except for the different pump.

Part B: Diaphragm Pump

Filtration of the monoalkyl tin trialkoxide solution from Example 2 began immediately after dilution. For this comparative filtration example, a 20 L NowPak container was equipped with a recirculation cap, allowing the solution to be circulated through a filtration loop.

The filtration loop consists of an electric diaphragm pump (Cole-Parmer PTFE-Diaphragm pump, Model #7090-42), pressure gauge, 5-nm Entegris UHP filter, particle counting manifold, and a three-way valve. The solution was recirculated for approximately two days to achieve 28 volume turnovers. Particle monitoring was carried out during filtration with a RION KS-41B laser system, which includes a syringe sampler (KZ-31W) and controller (KE-40B1). The system quantifies particle counts in select channel sizes via light scattering methods to sizes as small as 70 nm. The final, filtered material was bottled in a laminar flow hood into Aicello CB bottles. Particle counts for the 70, 150, and 200 nm channels are 34.2, 2.40, and 1.44 per mL, respectively. Table 3 summarizes counts at all channels, which represent the summary of particulate levels before bottling.

What is claimed is:

1. An article comprising a container formed of plastic or dealkalized material and, within the container, a composition comprising a mixture of a semiconductor grade solvent and a solvated monoalkyl tin trialkoxide ($RSn(OR')_3$), wherein the mixture has a tin concentration from about 0.004M to about 1.4M and a concentration of non-tin metals and metalloid elements of each no more than 3 parts-per-billion (ppb) by mass.

2. The article of claim 1 wherein the semiconductor grade solvent comprises an alcohol or mixture of alcohols.

3. The article of claim 1 wherein the composition comprises a radiation sensitive patterning composition.

4. The article of claim 1 wherein the R comprises an alkyl group, an aryl group, an alkenyl group, or a cycloalkyl group, wherein the R has 1-31 carbon atoms and forms a radiation sensitive carbon bond with the Sn.

5. The article of claim 1 wherein the R is a branched alkyl ligand represented by $R^1R^2R^3C$—, where $R^1$ and $R^2$ are independently an alkyl group with 1-10 carbon atoms, and $R^3$ is hydrogen or an alkyl group with 1-10 carbon atoms.

6. The article of claim 1 wherein the R comprises methyl ($CH_3$—), ethyl ($CH_3CH_2$—), isopropyl ($CH_3CH_3HC$—), t-butyl ($(CH_3)_3C$—), t-amyl ($CH_3CH_2(CH_3)_2C$—), sec-butyl ($CH_3(CH_3CH_2)CH$—), n-butyl ($CH_3CH_2CH_2CH_2$—),

TABLE 4

| | Channel Size | | | | | | | | | |
| --- | --- | --- | --- | --- | --- | --- | --- | --- | --- | --- |
| | 70 nm | 80 nm | 90 nm | 100 nm | 150 nm | 200 nm | 250 nm | 300 nm | 400 nm | 500 nm |
| Particles/ml | 34.24 | 13.32 | 9.8 | 7.36 | 2.40 | 1.44 | 0.76 | 0.52 | 0.36 | 0.28 | neopentyl $(CH_3)_3CCH_2$—), benzyl, allyl, cyclohexyl, cyclopentyl, cyclobutyl, or cyclopropyl.

7. The article of claim 1 wherein the R is an alkyl ligand or a cycloalkyl ligand with 1-31 carbon atoms with one or more carbon atoms substituted with one or more heteroatom functional groups containing S, O, N, Si, Ge, Sn, Te, and/or halogen atoms.

8. The article of claim 1 wherein the R' are independently hydrocarbon groups with 1-10 carbon atoms.

9. The article of claim 1 wherein the R' comprises a methyl group, ethyl group, isopropyl group, t-butyl group, or t-amyl group.

10. The article of claim 1 further comprising a monoalkyl tin trialkoxide $(R_1Sn(OR'')_3)$ wherein the R is different from $R^1$ and the R' is the same or different from R''.

11. The article of claim 1 comprising no more than about 1 mole % dialkyltin compounds.

12. The article of claim 11 having a tin concentration from about 0.005M to about 0.25M and the concentration of non-tin metals and metalloid elements of each no more than 2.5 parts-per-billion (ppb) by mass, wherein the solvent comprises an alcohol or mixture of alcohols.

13. The article of claim 1 having the concentration of non-tin metals and metalloid elements of each no more than 2.5 parts-per-billion (ppb) by mass.

14. The article of claim 1 wherein the mixture has a particle contamination of no more than about 40 particles per mL with a particle size of at least about 70 nm as determined by light scattering.

15. The article of claim 1 wherein the mixture has a particle contamination of no more than about 3 particles per mL with a particle size of at least about 150 nm as determined by light scattering.

16. A composition comprising a monoalkyl tin trialkoxide $(RSn(OR')_3)$, wherein a testing solution prepared by adjusting the composition with a solvent to form a solution with 0.044M tin ions has a contamination with non-tin metals and metalloid elements of each no more than 3 parts-per-billion (ppb) by mass.

17. The composition of claim 16 wherein the R comprises methyl $(CH_3$—), ethyl $(CH_3CH_2$—), isopropyl $(CH_3CH_3HC$—), t-butyl $((CH_3)_3C$—), t-amyl $(CH_3CH_2 (CH_3)_2C$—), sec-butyl $(CH_3(CH_3CH_2)CH$—), n-butyl $(CH_3CH_2CH_2CH_2$—), neopentyl $((CH_3)_3CCH_2$—), benzyl, allyl, cyclohexyl, cyclopentyl, cyclobutyl, or cyclopropyl and/or wherein the R' comprises a methyl group, ethyl group, isopropyl group, or t-butyl group.

18. The composition of claim 16 wherein the R is an alkyl ligand or a cycloalkyl ligand with 1-31 carbon atoms with one or more carbon atoms substituted with one or more heteroatom functional groups containing S, O, N, Si, Ge, Sn, Te, and/or halogen atoms.

19. The composition of claim 16 comprising no more than about 1 mole % dialkyltin compounds.

20. The composition of claim 16 having a particle contamination of no more than about 40 particles per mL with a particle size of at least about 70 nm as determined by light scattering.

21. The composition of claim 16 wherein the composition consists essentially of the monoalkyl tin trialkoxide $(RSn (OR')_3)$.

22. The composition of claim 16 having a particle contamination of no more than about 3 particles per mL with a particle size of at least about 150 nm as determined by light scattering.

23. The composition of claim 16 wherein the composition further comprises a monoalkyl tin trialkoxide $(R_1Sn(OR'')_3)$ wherein the R is different from $R_1$ and the R' is the same or different from R''.

* * * * *